(12) United States Patent
Cheung

(10) Patent No.: US 6,761,986 B2
(45) Date of Patent: Jul. 13, 2004

(54) THIN FILM INFRARED TRANSPARENT CONDUCTOR

(75) Inventor: Jeffrey T. Cheung, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/112,465

(22) Filed: Mar. 29, 2002

(65) Prior Publication Data

US 2002/0146599 A1 Oct. 10, 2002

Related U.S. Application Data

(60) Provisional application No. 60/282,337, filed on Apr. 6, 2001.

(51) Int. Cl.$^7$ .............................. B32B 19/00; B32B 9/00
(52) U.S. Cl. ....................... 428/701; 428/432; 428/433; 428/699; 428/702; 252/62.32 B; 252/62.3 V; 252/62.3 ZT; 106/286.1; 106/286.5; 106/286.8; 106/287.17
(58) Field of Search ................................. 128/432, 433, 128/699, 701, 702; 252/62.32 B, 62.3 V, 62.3 ZT; 106/286.1, 286.2, 286.5, 286.6, 286.8, 287.17

(56) References Cited

U.S. PATENT DOCUMENTS

| | | |
|---|---|---|
| 5,397,920 A | 3/1995 | Tran ............................. 257/749 |
| 6,072,117 A * | 6/2000 | Matsuyama et al. ......... 136/256 |
| 6,448,492 B1 * | 9/2002 | Okada et al. ........... 174/35 MS |

OTHER PUBLICATIONS

R. Ferro, et al: *F–Doped CdO Thin Films Deposied by Spray Pyrolysis*, pp. 477–483.

T.J. Coutts, et al, *Search for Improved Transparent Conducting Oxides: A Fundatmental Investigation of CdO, $Cd_2SnO_4$, and $Zn_2SnO_4$*, American Vacuum Society 2000, pp. 2646–2660.

Tadatsugu Minami, *New N–Type Transparent Conducting Oxides*, MRS. Bulletin/Aug. 2000, vol. 25, No. 8, pp. 38–43.

PCT Search Report, PCT/US02/10651, 4 pages.

C. H. Champness, J.K. Chen and K. Ghoneim, *A Conventional Se–CdO Cell of Improved Performance*, 1984 IEEE, pp. 933–938.

X.W. Sun, et al, *Improved ITO Thin Films with a Thin ZnO Buffer Layer by Sputtering*, 2000 Elsevier Science S.A., pp. 75–81.

T.K. Subramanyam, et al, *Influence of Oxygen Pressure on the Structural and Optical Properties of DC Magnetron Reactive Sputtered Cadmium Oxide Films*, Pysica Scripta, vol. 57, 317–320, 1998.

K. Tanaka, et al, *Electrical and Optical Properties of Sputtered CdO Films*, Dialogtech File No. 2 Accession No. 6442870, pp. 1–2.

Murthy, L.C.S., et al, *Thickness Dependent Electrical Properties of CdO Thin Films Prepared by Spraypyrolysis Method*, Dialogtech Document, p. 1.

(List continued on next page.)

Primary Examiner—Deborah Jones
Assistant Examiner—G. Blackwell-Rudasill
(74) Attorney, Agent, or Firm—Koppel, Jacobs, Patrick & Heybl

(57) ABSTRACT

A doped Cadmium Oxide (CdO) film has been developed for use in applications requiring conductive, films which are highly transparent to IR radiation. Suitable dopants for the film include any of the Group III elements, namely Boron, Aluminum, Gallium, Indium, or Thallium.

14 Claims, 5 Drawing Sheets

OTHER PUBLICATIONS

A.M. Baranov, et al, *Investigation of the Properties of CdO Films*, American Institute of Physics 1997, pp. 805–806.

T.K. Subramanyam, et al, *Preparation and Characterization of CdO Films Deposited by dc Magnetron Reactive Sputtering*, Elsevier Science V 1998, pp. 214–220.

* cited by examiner

THIN FILM INFRARED TRANSPARENT CONDUCTOR

This application claims benefit of U.S. Provisional Application Serial Number 60/282,337 filed Apr. 6, 2001.

BACKGROUND OF THE INVENTION

1. Field of the Invention

This invention relates to Infrared transparent conductive thin films for use in electro-optical devices.

2. Description of the Related Art

Many electro-optical devices operating in the infrared require conductive thin films that are extremely transparent. Such devices include liquid crystal cells for beam steering, spatial light modulators, and optical switches for fiber optical communications, transparent conductive electrodes for elector-optical devices such as electo-optical crystals and photo refractive polymers, and long wavelength vertical cavity surface emitting lasers (VCSELs). Conventional transparent conductive oxides such as Indium Tin Oxide (ITO), ZnO and $SnO_2$ cannot fulfill the application specification. These materials are mostly transmissive in the visible, however transmission in the Infrared drops due to free carrier absorption. FIG. 6 is a plot of the transmission values versus wavelength for the prior art ITO and ZnO films on a glass substrate. The ITO film, which is generally the most transparent of the two has a transparency below 60% at 1.31 $\mu$m and below 40% at 1.55 $\mu$m for a film with a sheet resistance of about 10 $\Omega/\square$. For ITO films with a sheet resistance of about 200 $\Omega/\square$ the transmission is about 96% at 1.31 $\mu$m and about 95% at 1.55 $\mu$m. 1.31 $\mu$m and 1.55 $\mu$m are critical values for fiber-optic communication and long wavelength VCSELs applications. Doped semiconductor wafer or epitaxial layers (Si, Ge, GaAs, InP doped) have limited utility because they do not cover the entire spectral range, have a limited size and are expensive.

As such, there has been a long felt need for Infrared transparent conductive films.

Cadmium Oxide films doped with Indium (CdO:In) have been prepared in the past for flat-panel displays and solar cells which require transparency in the visible and UV region. However, these films are well known for their toxicity, and therefore the prior art has steered away from developing such films. Minami et al reports that CdO:In films have been prepared with a resistively of the order of $10^{-5}$ $\Omega$ cm for flat-panel displays and solar cells, but he states that they are of no practical use because of Cd toxicity. (Minami, Tadatsugu, "New n-Type Transparent Conducting Oxides", *Transparent Conducting Oxides*, Volume 25, No. 8, August 2000, page 38). Further, because these films have a yellow color, which differentiates them from prior art transparent films which are clear in appearance, one skilled in the art would be steered away from using these films for any applications requiring transparent films Undoped CdO has been prepared by sputtering, MOCVD, and spray pyrolysis (Murthy, L. C. S. & Rao, K. S. R. K., "Thickness Dependent Electric Properties of CdO Thin Films Prepared by Spray Pyrolysis Method," *Bulletin of Material Science*, Vol 22, No 6, pp953–7 (October 1999); Subramarnyam, T.K et al, "Preparation and Characterization of CdO Films Films Deposited by DC Magnetron Reactive Sputtering", *Materials Letter*, Vol. 35, pp 214–220, (May 1998); Baranov, AM. et al, "Investigation of the Properties of CdO Films", *Tech. Phys. Ltr*, 23, (10) pp 805–806 (October 1997)). Transmission as high as 85% has been reported in the wavelength range of 600–1600 nm. (see Subramarnyam, p. 218). Baranov et al also reports that the CdO film has been considered for other applications such as solar cells which require transparent electrodes for the visible or UV spectra. In addition, Ferro, R et al has reported fluorine doped CdO films. But the transmissivity of these films are below about 90% with decreasing transmissivity as more Fluorine is added (Ferro, R et al "F-Doped CdO. Thin Films Deposited by Spray Pyrolysis", PMS. State. Sol. (a) 177, P477–483(200). Data plotted in FIG. 6 shows these materials to be similar to prior art undoped ITO and ZnO films.

There is a need for films with lower resistivity which also transmit substantially all of incident IR light. Further, due to losses in systems incorporating these films, transmissivity of IR in the IR spectrum, particularly at 1.31 or 1.55 $\mu$m must be at least 99% for practical use of these materials.

SUMMARY OF THE INVENTION

A doped Cadmium Oxide (CdO) film has been developed for use in applications requiring conductive, Infrared transparent films. Suitable dopants for the film include any of the Group III elements (i.e. Boron, Aluminum, Gallium, Indium, or Thallium). Additionally, it is believed that suitable films can be prepared using F or H as dopants if properly processed.

The new doped film is substantially transparent to Infrared radiation in the range of between about 0.5 $\mu$m and 10 $\mu$m showing exceptionally high transmission throughout the IR range (99.8% at 1.31 microns; 99.5% at 1.55 micron; 97% at 3 microns; 93% at 5 microns; and 82% at 10 microns) on sapphire or NGO as glass has very low or no transmission in their frequencies evaluated. These measurement where made using films deposited. The new film has a resistivity of from about 5 to about $10\times10^{-5}$ $\Omega$. Deposited on a glass substrate, the film shows a low sheet resistance of approximately 200 ohm/square.

There are numerous possible applications for such films including liquid crystal cells for beam steering, spatial light modulators, and optical switches for fiber optical communications, transparent conductive electrodes for elector-optical devices such as electo-optical crystals and photo refractive polymers, and long wavelength vertical cavity surface emitting lasers.

These and other features and advantages of the invention will be apparent to those skilled in the art from the following detailed description, taken together with the accompanying drawings, in which:

DETAILED DESCRIPTION OF THE INVENTION

Figure 1:
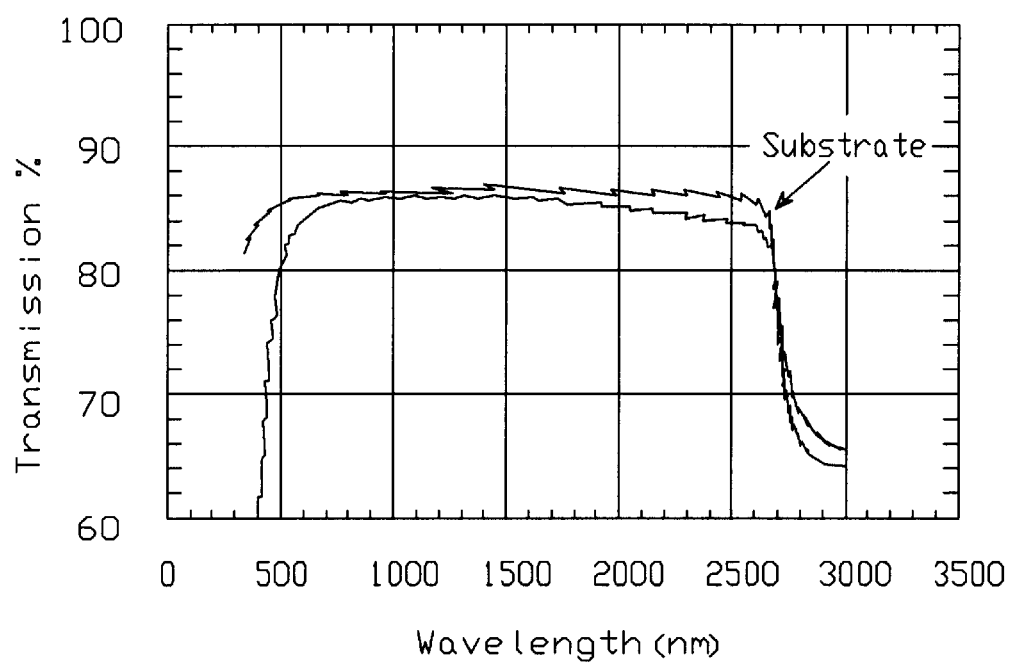
FIG. 1 is a plot showing the X ray diffraction data for an In:CdO film incorporating features of the invention compared to the transmission of the substrate upon which it is mounted.
Figure 2:
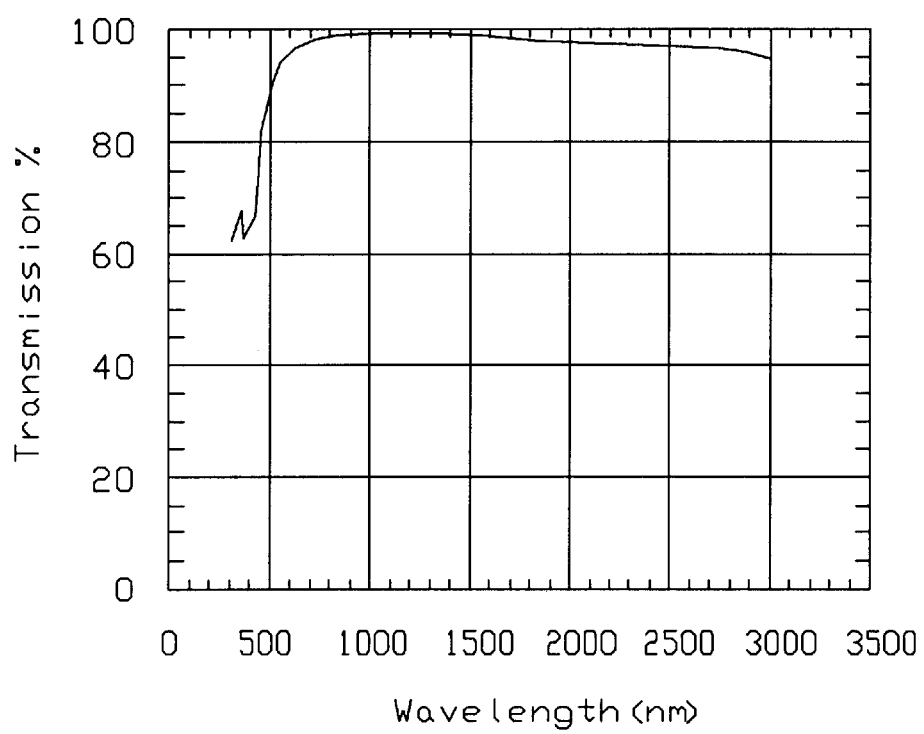
FIG. 2 shows the transmission of the film of FIG. 1 normalized by subtraction of the transmissivity of the substrate for the range of 500 $\mu$m to 3000 nm.

A doped Cadmium Oxide (CdO) film has been developed for use in applications requiring conductive, Infrared transparent films. Suitable dopants for the film include any of the Group III elements (i.e. Boron, Aluminum, Gallium, Indium, or Thallium). Additionally, it is believed that properly prepared films doped with F or H also have the desired transmissivity. These dopants are believed to increase the electron concentration of CdO, thus making it more conductive.

There are numerous applications for the film, including:

1) transparent conductive electrodes for liquid crystal cells used in beam steering, spatial light modulators, and optical switches, particularly optical switches operating at $1.31\mu$ and $1.55\mu$ for fiber optical communication.
2) Transparent/conductive electrodes for electro-optical devices such as electro-optical crystals and photo-refractive polymers (using a longitudinal configuration where the electric field is parallel to the propagation of light, explained in more detail below)
3) Improved shielding from Electromagnetic (EM) or Radio Frequency (RF) interference.
4) Increased efficiency for commercial aircraft radar control system.
5) Top electrodes for long wavelength transmission Vertical Cavity Surface emitting Lasers (VCSELs); and
6) electrodes for ferroelectric and piezoelectric devices.

The CdO films doped with Group III elements to achieve a sheet resistance of approximately 120 $\Omega/\square$ have a high transmission throughout the IR range (99.8% at 1.31 $\mu$m; 99.5% at 1.5 micron; 97% at 3 microns; 93% at 5 microns; and 82% at 10 microns). Resistivity of the films is about $6\times10^{-5}$ to about $10\times10^{-5}$ $\Omega$-cm. This is among the lowest of values for such type of known films currently used. For example, Indium Tin Oxide (ITO), which is the most commonly used, has an electrical resistivity in the range of $2-5\times10^{-4}$ $\Omega$-cm.

The film can be grown on any suitable substrate such as MgO, glass, quartz etc. Many known methods for thin film growth are suitable for growing the Group III element doped CdO film according to the present invention. These methods include Pulsed Laser Deposition (PLD), sputtering, Metal Organic Chemical Vapor Deposition (MOCVD), Spray Pyrolysis, Sol-gel, Vapor transport, Hot Wall Epitaxy, Close-space Vapor Transport, Plasma Chemical Vapor Deposition (PCVD), Activated Reactive Evaporation, and Thermal Co-evaporation using separate sources for the host material (CdO) and the dopant. (see *Handbook of Deposition Technologies For Films and Coatings*, Second Edition, Noyes Publications, Bunshah, R. F. 1994).

A preferred method is Pulsed Laser Deposition (PLD) since it allows for accurate control of the film composition and thickness, and facilitates the activation of dopants. This method is described in great detail in "Pulsed Laser Deposition of Thin Films", Chrisey, 1994. Specifically, the experimental set up comprises a target holder and a substrate holder housed in a vacuum chamber. A well blended mixture of material to be vaporized and condensed on the substrate is placed in a target holder. A high-power laser used as an external energy source is focused on the target to vaporize the mixture in a controlled manner. Various optical components are used to focus and raster the laser beam over the target surface. (see "Pulsed Laser Deposition of Thin Films" Chrisey, 1994, p. 3). Absorption characteristics of the material to be evaporated determine the laser wavelength to be used. Pulse width, repetition rate, and pulse intensity are selected for specific applications. (see Bunshah, pg. 167). The thickness of the film can be controlled by varying the pulse time and distance of the target. The PLD process has so far produced films having a thicknesses of between 100–4000 Å. The composition of the grown film is substantially the same as that of the target composition.

For preparation of the CdO film incorporating features of the invention, a preferred composition contains from about 0.5%, to about 6% by weight of the dopant. The films can be grown at temperature from about 20° C. to about 425° C. The substrate temperature affects the quality of the film with higher temperature producing a film with more conductivity and transparency in the IR and visible range. Specific procedures for growth of doped CdO films are set forth in the examples below.

EXAMPLE 1

Growth of Indium Doped CdO ("In:CdO") by PLD

A ceramic target comprising $In_2O_3$ and CdO was placed in the target holder of the PLD chamber about 10 inches away from a MgO substrate. The target was prepared by mixing 1% by weight $In_2O_3$ powder with 99% by weight CdO powder in a jar, filling the jar with a quantity of methanol approximately equal in volume to the $CdO/In_2O_3$ mixture to form a slurry, and adding a like volume of ceramic beads (approximately 1 cm in diameter) to the mixture. The mixture was then "rolled" for 24 hours, the process being known as "ball milling". The methanol was then evaporated from the mixture and the beads were sifted out. The remaining powder was pressed into a cylindrical shape and sintered in a high temperature furnace (about 1100° C.) to form a ceramic target.

The target was then placed in a vacuum chamber having an $O_2$ partial pressure of approximately 5 millitorr and the temperature of the chamber was raised to 440° C. The target was irradiated using a Kr:F excimer laser beam having a wavelength of 248 nm with a pulse energy of 390 mJ/pulse at a frequency of 5 pulses/sec. The energy delivered by the laser was 1 $J/cm^2$ with a pulse duration of 32 nano seconds. The resultant In:CdO film formed had a thickness of 300 Å.

Figure 9:
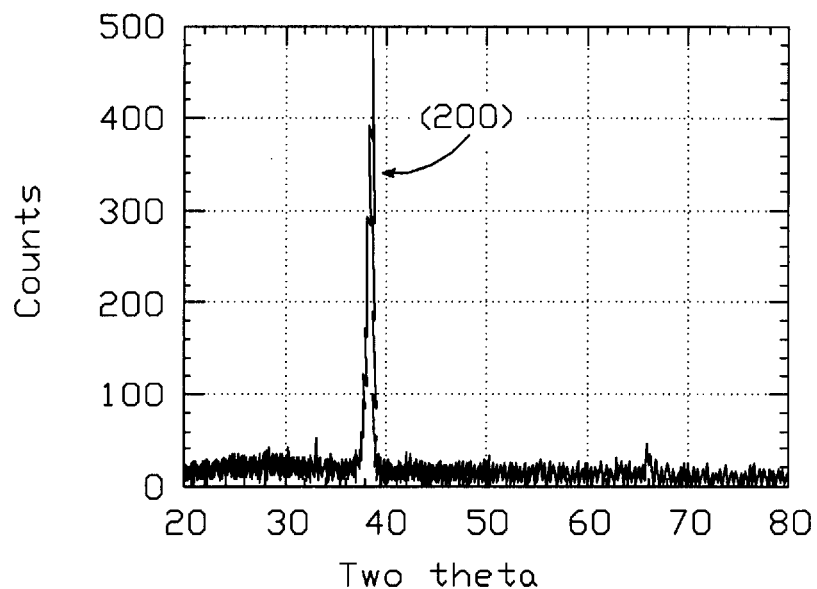
FIG. 9 shows the x-ray diffraction pattern for an In:CdO film according to the invention.

FIG. 9 is a plot showing the X ray diffraction data for an In:CdO film prepared using the process described above. The material is crystalline and has the same peak as undoped CdO with a (200) crystalline orientation.

Figure 3A:
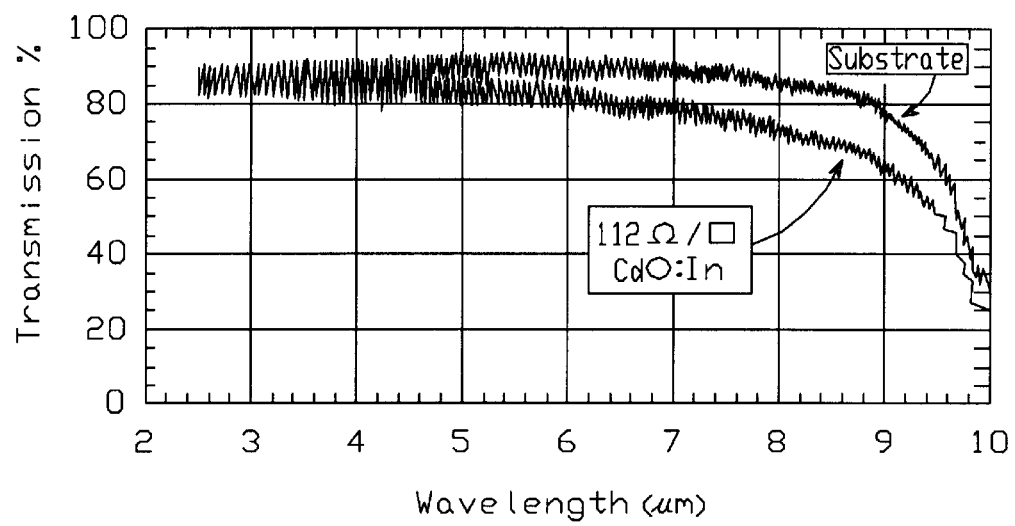
FIG. 3*a* is a plot showing the % transmission versus wavelength for the In:CdO film on a substrate for wavelength from 2.5 to 10 $\mu$m.
Figure 3B:
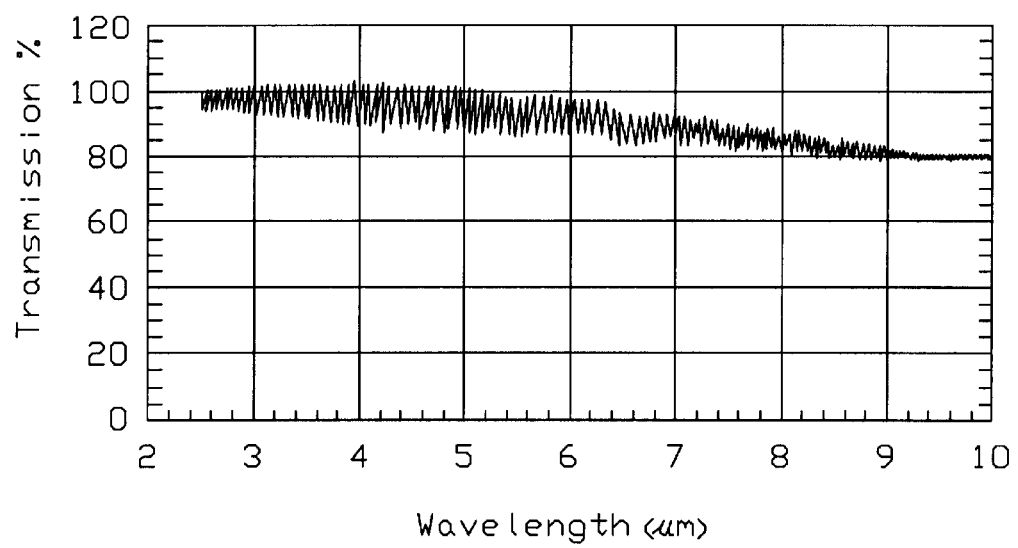
FIG. 3*b* is a plot showing the % transmission of the film FIG. 3*a*, after substraction of the effect of the substrate.

The sheet resistance and transmission spectra of the film were measured using a Cary model instrument for the transmission measurements. The In:CdO film was found to have a sheet resistance of 112 $\Omega/\square$ and exceptionally high transmission as shown in FIGS. 1–5. The transmission of the film shown in FIG. 2 was determined by measuring the transmission of the substrate and dividing the combined transmission measured for the film and substrate together by the transmission of the substrate alone (see FIG. 1). FIGS. 3a and 3b are plots showing the % transmission versus wavelength for the In:CdO film for a portion of the IR range. The upper curve of FIG. 3a shows the transparency of the MgO substrate without the film, and the lower curve of FIG. 3a shows the transparency of the film and substrate combination. FIG. 3b shows the value for film transmission obtained from the % transmission of the film and substrate divided by the % transmission of the film. FIGS. 3a and 3b shows % transmission for wavelengths between 2.5 to 10 microns. As can be seen, the doped CdO film is nearly 100% transparent at the lower wavelengths, and still around 80% transparent at 10 microns.

Figure 4:
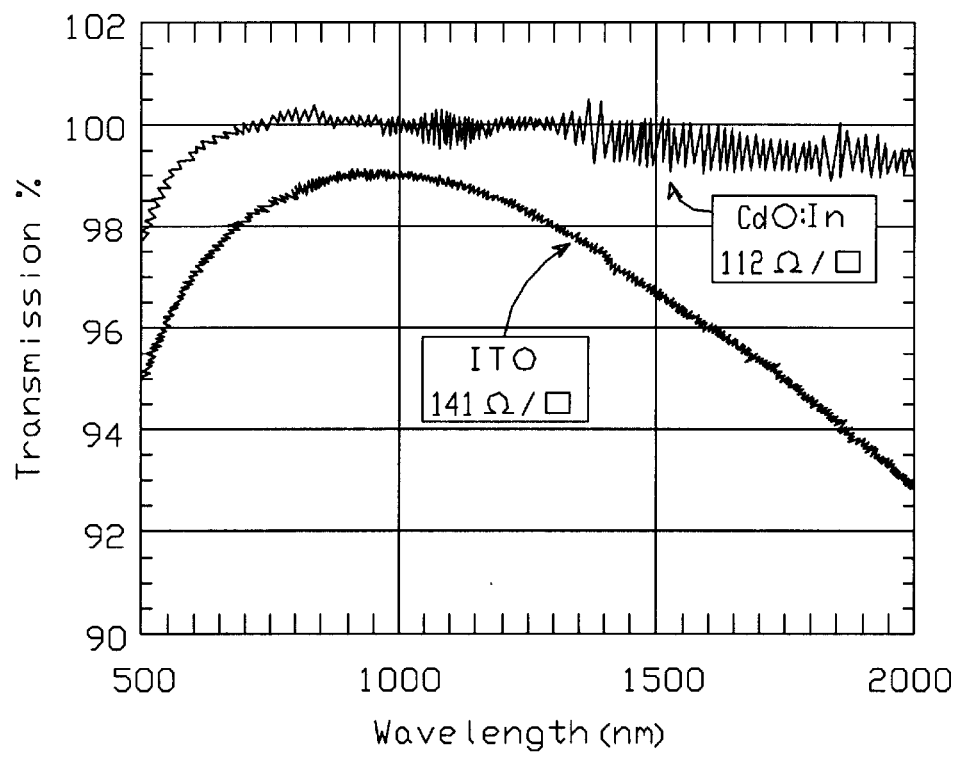
FIG. 4 is a plot comparing % transmission of the In:CdO film with a prior art ITO film of comparable sheet resistance for wavelength from 500 to 2000 nm.
Figure 5:
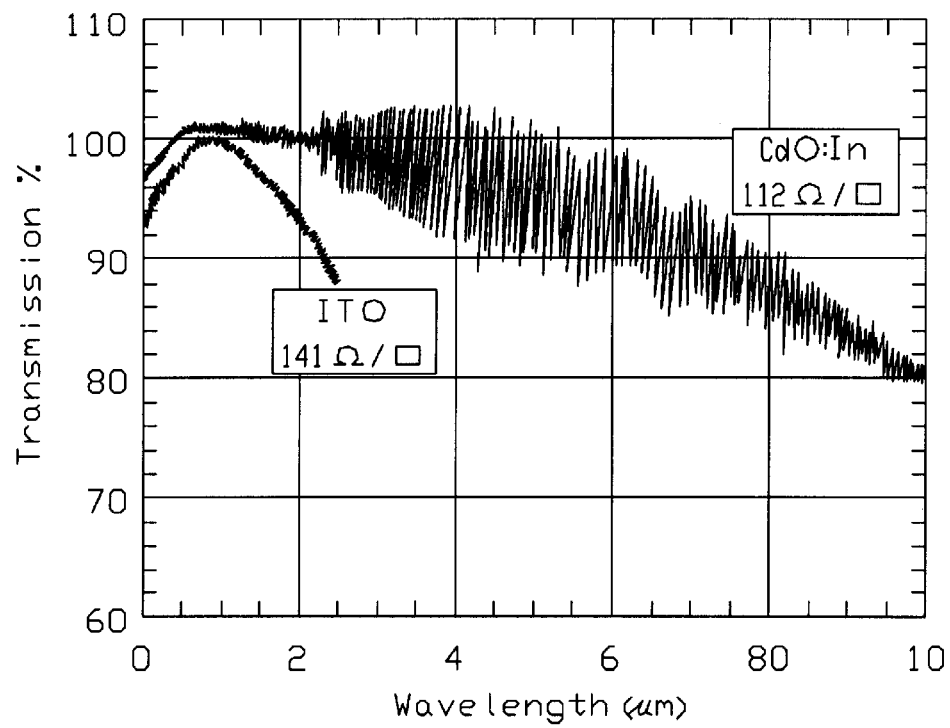
FIG. 5 is a combination of FIGS. 3*b* and 4 for wavelength of 0.5 to 10 $\mu$m.
Figure 6:
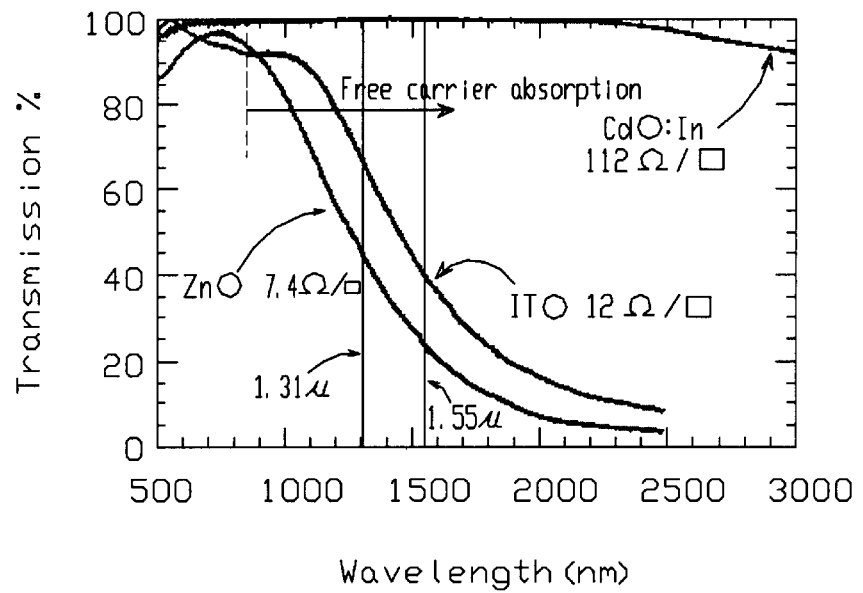
FIG. 6 is a graph showing the transmission values versus wavelength for prior art ITO and ZnO films of comparable sheet resistance on a glass substrate compared to Indium doped CdO film of the invention.

In FIG. 4 the % transmission of the In:CdO film is compared to a prior art ITO film (on a glass substrate). FIG. 5 shows FIGS. 3b and 4 combined. Both films have a comparably low sheet resistance (112 $\Omega/\square$ for the In:CdO film, and 141 $\Omega/\square$ for the ITO film). However, the light transmission for the ITO film is significantly less than the transmission for the In:CdO film. As can be seen from the Figures, the transmission for the ITO film peaks at about 99% at approximately 1000 nm but then drops significantly for light of a higher or lower frequency. In contrast, the transmission of the In:CdO films remains constant at around 100% throughout the 500 to 2000 nm range. In addition % transmission for the In:CdO film remains significantly high for wavelengths up to 10 microns. (The broad variation of transmission values shown in the Figures such as in FIG. 5 above about 2 nm is due to scatter in the reading instrumentation. It is reasonable to use an average value.) Of particular significance is the high transmission values for the In:CdO films obtained at 1.31 and 1.55 microns which are frequency levels used, in fiber optic communication systems.

An alternative method of contrasting indium-doped CdO films with prior known conductive films is to compare the refractive index (N) and the complex refractive index (R) of both.

The complex refractive index (R) is obtained from the following relationship $$T = I/I_o = e^{\alpha d}$$

Where:
$\alpha = 4\Pi k/\lambda$ = extinction coefficient
$\lambda$ = wavelength
d = thickness of the film
$I/I_o$ (% transmission) = light incident/light transmitted As indicated above, a particularly preferred operating wavelength is 1.55 microns.

Figure 10:
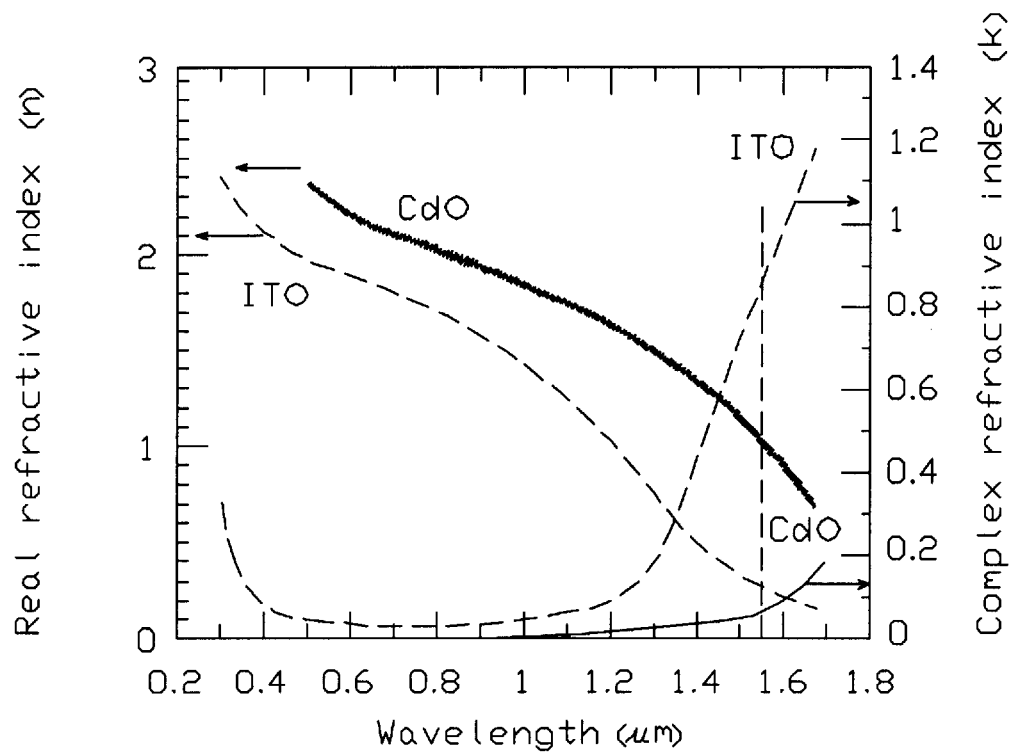
FIG. 10 is a graph comparing the refractive index indium doped CdO films with that of indium tin oxide films.

FIG. 10 shows the real and complex refractive index, as measured by variable angle spectroscopic ellipsometry, for indium doped CdO and ITO films.

At that wavelength, the real refractive index of the doped CdO film is about 4 times that of the ITO film (1.3 N 0.33). In contrast, the complex refractive index (R), which allows comparison with performance normalize to eliminate variables such as thickness shows a value 18 times greater (0.05 v 0.9) for the doped CdO film.

Gallium doped CdO has similar properties to the Indium doped CdO. Other Group III elements should provide similar properties. Also, films prepared by vapor transport appear to behave similarly. Hydrogen doping or co-doping, accomplished by adding $H_2$ in the chamber atmosphere during film production allows growth of low resistivity films such as described herein at lower temperatures (approximately 200° C.)

A first application of the doped CdO films is for transparent conductive electrodes for liquid crystal cells used in beam steering, typically operating at wavelength up to about 20 microns, spatial light modulators which operate up to 14 microns, and optical switches which operate at 1.31$\mu$ and 1.55$\mu$ for fiber optical communication.

A second use is in the transparent/conductive electrodes for electro-optical devices such as electro-optical crystals and photo-refractive polymers using a transverse configuration where the electric field is parallel to the propagation of light.

Figure 7:
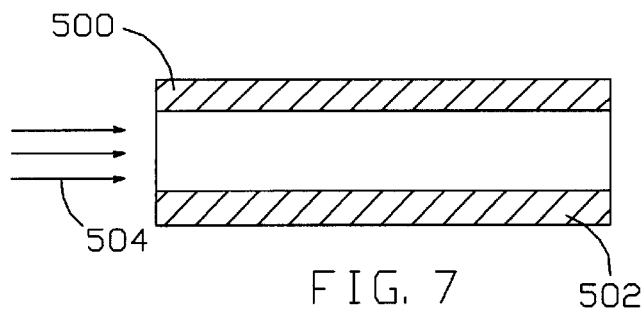
FIG. 7 is a cross sectional view of a conventional electro-optical device.

Conventional transparent/conductive electrode devices have two Pt electrodes 500, 502 sandwiching a photoelectrically active material (see FIG. 7). Voltage applied through the Pt electrodes 500, 502 causes a change in the liquid crystal material sandwich there between. However, since Pt electrodes 500, 502 are not transparent, radiation 504 has to be delivered through the end of the device, parallel to the plane of the electrodes. As such, the amount of radiation collected is proportional to the distance between the electrodes. Since the amount of voltage required is increased as the distance between the electrodes increases, there is a tradeoff between the amount of radiation collected. Voltage minimization is needed. Additionally, since Pt is a noble element, it does not adhere well to the material, and eventually detaches or delaminates.

Figure 8:
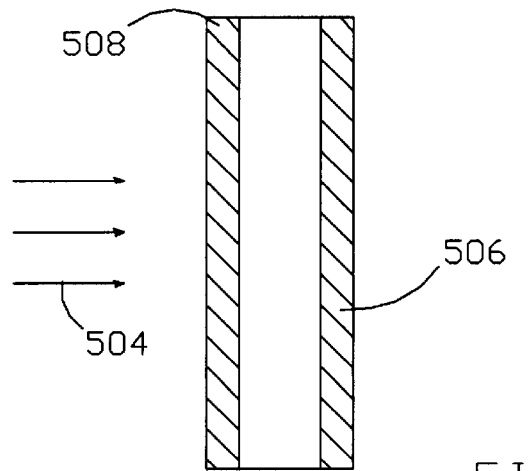
FIG. 8 is a cross sectional view of an electro-optic device in accordance with the invention.

Replacing the Pt electrodes with doped CdO electrodes will allow IR radiation to enter through the electrodes since they are transparent. Hence the device can be configured as shown in FIG. 8. Thus the electrodes 506, 508 can be closer together to create a thinner device which requires less voltage. A further advantage is that the sandwiched electro optical material more readily adheres to the doped CdO electrodes.

In certain applications utilizing IR signals, improved function results from receiving cleaner IR signals by filtering out higher frequency signals which can result from ambient electromagnetic (EM) or radio frequency (RF) transmissions. The CdO doped film is suitable for this purpose.

Typical frequencies used for fiber optic communications are 1.31 and 1.55 $\mu$m. Also vertical cavity surface emitting Lasers (VCSELs) operate in the 1.55 $\mu$m range. Since transparent electrodes are not available to overcome the problems in this range, metal ring electrodes are used. Metal ring electrodes are inefficient and do not work with big lasers as the large required ring has less surface area for transferring current, thus limiting the amount of current that can be transferred, and resulting in non-uniform current density transfer. The ring also blocks some of the light that is delivered. Use of doped CdO electrodes in accordance with the invention provides a large uniform area for uniform injection since the transparent electrode enables light to come from the top.

Because the doped CdO films are highly conductive they can also be used as electrodes for ferroelectric (e.g. piezoelectric) devices where IR transmission is not of concern. Conventional devices use Pt electrodes which do not adhere well to the piezoelectric and eventually peals off. Doped CdO is more compatible and adhesive.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An electrically conductive thin film comprising cadmium oxide (CdO) doped with at least one element from the group consisting of B, Al, Ga, In and Tl wherein the concentration of said dopant is between 0.05% and 6% by weight, said CdO further doped with hydrogen (H), the doped film having a transmissivity of at least about 90% at optical wavelengths of about 500 to about 5000 nm.

2. An electrically conductive thin film comprising cadmium oxide (CdO) doped with at least one element from the group consisting of B, Al, Ga, In and Tl, the doped film having a transmissivity of at least about 90% at optical wavelengths between about 500 nm and about 5000 nm, wherein said film also provides RF or EMI shielding properties.

3. An electrically conductive thin film comprising cadmium oxide (CdO) doped with at least one element from the group consisting of B, Al, Ga, In and Tl, said CdO further doped with hydrogen, the doped film having a transmissivity of at least about 90% at a optical wavelengths of from about 500 to about 5000 nm.

4. A electro-optical device, comprising:

a first substrate what is substantially transparent to light incident on the device;

a second substrate;

a layer of liquid crystal material disposed between the first and second substrates;

a first electrode on said first substrate proximate to said liquid crystal layer, said first electrode comprising an electrically conductive thin film comprising cadmium oxide (CdO) doped with at least one element from the group consisting of B, Al, Ga, In and Tl, the doped film having a transmissivity of at least about 90% at optical wavelengths between about 500 and about 5000 nm; and a second electrode on said second substrate proximate to said liquid crystal layer.

5. The device of claim 4, wherein said doped film has a resistivity of between $5 \times 10^{-5}$ and $17 \times 10^{-5}$ $\Omega$-cm.

6. The device of claim 4, wherein said second substrate is substantially transparent to light incident on the device, and said second electrode comprises an electrically conductive thin film comprising CdO doped with at least one element from the group consisting of B, Al, Ga, In and Tl, the doped film having a transmissivity of at least about 90% at optical wavelengths between about 500 and about 5000 nm.

7. The device of claim 4, wherein said device is a beam steering liquid crystal cell.

8. The device of claim 4, wherein said device is a spatial light modulator.

9. The device of claim 4, wherein said device is an optical switch.

10. The device of claim 4, wherein said device is an optical filter.

11. The device of claim 4, wherein said doped film has a transmissivity of at least about 98% at an optical wavelength of about 1550 nm.

12. The device of claim 4, wherein said doped film has a transmissivity of at least about 95% at optical wavelengths of between about 500 nm and about 3000 nm.

13. The device of claim 4, wherein said doped film has a transmissivity of at least about 93% at optical wavelengths of between about 500 nm and about 5000 nm.

14. The device of claim 4, wherein said doped film has a transmissivity of at least about 80% at optical wavelengths of between about 500 nm and about 10000 nm.

* * * * *